United States Patent [19]

Mittel et al.

[11] Patent Number: 5,841,822
[45] Date of Patent: Nov. 24, 1998

[54] BAND-PASS SIGMA-DELTA CONVERTER AND COMMUTATING FILTER THEREFOR

[75] Inventors: James Gregory Mittel, Lake Worth; Raymond Louis Barrett, Jr., Ft. Lauderdale; Walter Davis, Parkland, all of Fla.

[73] Assignee: Motorola, Inc., Schaumburg, Ill.

[21] Appl. No.: 982,179

[22] Filed: Dec. 1, 1997

Related U.S. Application Data

[62] Division of Ser. No. 684,716, Jul. 22, 1996, Pat. No. 5,768,315.

[51] Int. Cl.[6] ................................................ H04B 1/10
[52] U.S. Cl. ...................... 375/350; 341/172; 333/172; 333/173; 327/554
[58] Field of Search .......................... 375/350; 341/172; 333/165, 167, 172, 173; 327/554, 557

[56] References Cited

U.S. PATENT DOCUMENTS

| | | | |
|---|---|---|---|
| 4,392,068 | 7/1983 | Welles, II | 333/172 |
| 4,518,936 | 5/1985 | Sutphin, Jr. | 333/173 |
| 4,581,602 | 4/1986 | Reichart | 341/138 |

*Primary Examiner*—Don N. Vo
*Attorney, Agent, or Firm*—R. Louis Breeden

[57] ABSTRACT

A communication receiver (600) utilizes a band-pass sigma-delta converter (100) for receiving a radio signal. The band-pass sigma-delta converter (100) includes a comparator (106) coupled to an adder-filter (101) for making a comparison between a predetermined reference level (110) and an intermediate signal (125), and for generating a comparison result signal (114) responsive to the comparison. A storage element (108) is used for storing the comparison result signal (114) for a predetermined delay period, thereby producing a clocked output signal (118). The adder-filter (101) is coupled to an analog signal (103) and to the clocked output signal (118) for subtracting the clocked output signal (118) from the analog signal (103) to produce a difference signal (120) that is filtered by a commutating filter (400) for generating the intermediate signal (125) responsive to the difference signal (120).

4 Claims, 9 Drawing Sheets

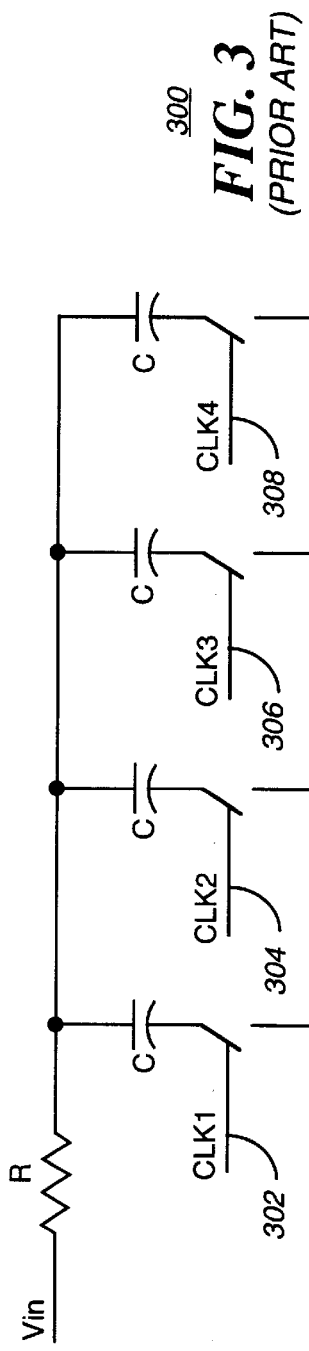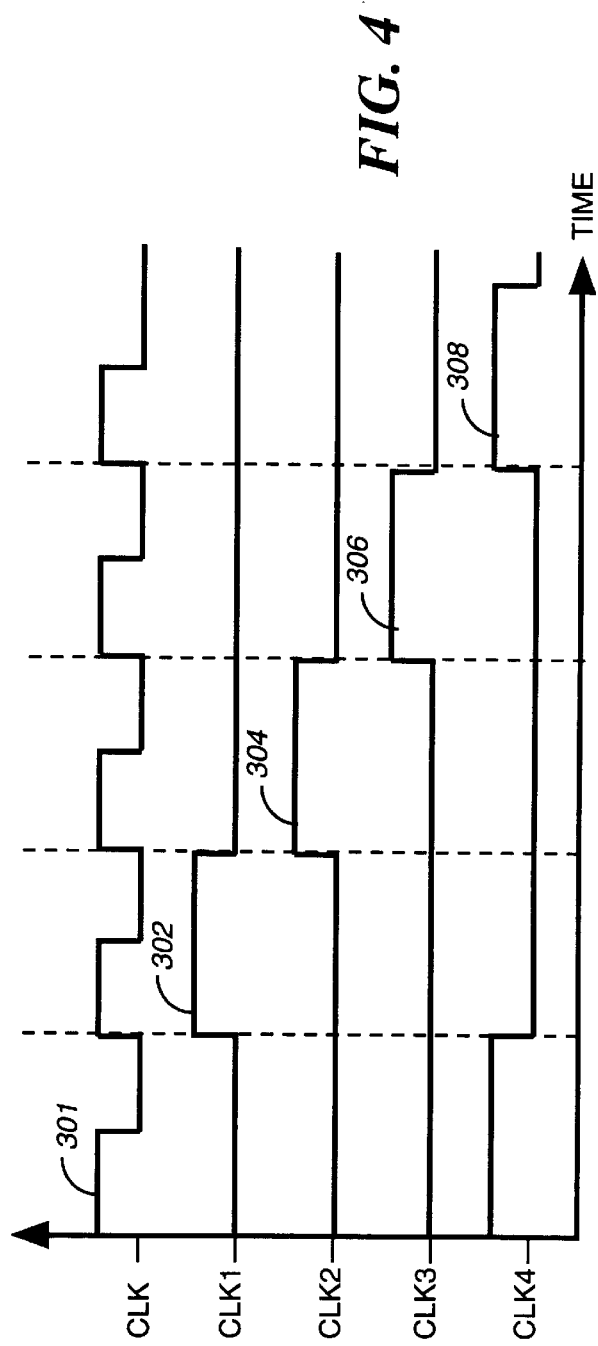

5,841,822

BAND-PASS SIGMA-DELTA CONVERTER AND COMMUTATING FILTER THEREFOR

This is a division of application Ser. No. 08/684,716, filed Jul. 22, 1996, now U.S. Pat. No. 5,768,315.

FIELD OF THE INVENTION

This invention relates in general to communication receivers, and more specifically to band-pass sigma-delta converters for use in communication receivers.

BACKGROUND OF THE INVENTION

With the advent of high performance, low cost complementary metal oxide semiconductor (CMOS) digital logic circuits, many traditionally analog radio receiver functions have begun to be performed digitally. Many successful designs have incorporated, for example, analog-to-digital converters of the sigma-delta architecture. This architecture has required a minimum amount of analog circuitry.

Analog-to-digital converters of the sigma-delta architecture typically provide a coarse quantization analog-to-digital conversion of an input signal. Such converters typically incorporate a low-pass or band-pass filter to reduce the quantization noise in the frequency band of the desired input signal. For converters utilizing a band-pass filter, one embodiment of the filter has been a passive inductor-capacitor (LC) tank circuit. The LC tank circuit is undesirable because it is large, discrete, and requires tuning during manufacture. To eliminate the undesirable aspects of the LC tank circuits, fully integrated, switched capacitor resonator structures have been developed. The switched capacitor resonator structures have utilized high-performance operational amplifiers, which unfortunately have demanded high power for operation. High power consumption is not desirable in battery powered portable devices, such as portable communication receivers.

Thus, what is needed is a high performance, fully integrated, band-pass sigma-delta converter structure that requires no tuning during manufacture and does not require the high performance amplifiers with the associated high power consumption.

SUMMARY OF THE INVENTION

An aspect of the present invention is a band-pass sigma-delta converter. The band-pass sigma-delta converter comprises a comparator coupled to an adder-filter for making a comparison between a predetermined reference level and an intermediate signal generated at an intermediate node by the adder-filter, and for generating a comparison result signal responsive to the comparison, and a storage element coupled to the comparator for storing the comparison result signal for a predetermined delay period controlled by a master clock signal, thereby producing a clocked output signal. The adder-filter is coupled to an input signal and coupled to the clocked output signal for subtracting the clocked output signal from the input signal to produce a difference signal having a signal polarity and for generating the intermediate signal responsive to the difference signal. The adder-filter comprises a commutating filter coupled to the intermediate node for generating the intermediate signal in response to the difference signal.

A second aspect of the present invention is a band-pass sigma-delta converter. The band-pass sigma-delta converter comprises a comparator coupled to an adder-filter for making a comparison between a predetermined reference level and an intermediate signal generated at an intermediate node by the adder-filter, and for generating a comparison result signal responsive to the comparison, and a storage element coupled to the comparator for storing the comparison result signal for a predetermined delay period controlled by a master clock signal, thereby producing a clocked output signal. The adder-filter is coupled to an input signal and coupled to the clocked output signal for subtracting the clocked output signal from the input signal to produce a difference signal having a signal polarity and for generating the intermediate signal responsive to the difference signal. The adder-filter comprises a commutating filter coupled to the intermediate node for generating the intermediate signal in response to the difference signal. The commutating filter comprises a plurality of capacitors each having a capacitor polarity, and a commutating circuit coupled to the plurality of capacitors. The commutating circuit is arranged to periodically alternate a relative polarity between the difference signal and the plurality of capacitors by performing one of (a) periodically alternating the signal polarity while leaving the capacitor polarity fixed, and (b) periodically alternating the capacitor polarity while leaving the signal polarity fixed.

A third aspect of the present invention is a communication receiver. The communication receiver comprises an antenna for intercepting a radio signal comprising information, a receiver element coupled to the antenna for down-converting the radio signal to derive an analog signal and for demodulating the analog signal, a processing system coupled to the receiver element for processing the information, a clock generator coupled to the processing system for generating a master clock signal, a user interface coupled to the processing system for conveying the information to a user, and user controls coupled to the processing system for providing control of the communication receiver by the user. The receiver element comprises a band-pass sigma-delta converter. The band-pass sigma-delta converter comprises a comparator coupled to an adder-filter for making a comparison between a predetermined reference level and an intermediate signal generated at an intermediate node by the adder-filter, and for generating a comparison result signal responsive to the comparison, and a storage element coupled to the comparator for storing the comparison result signal for a predetermined delay period controlled by a master clock signal, thereby producing a clocked output signal. The adder-filter is coupled to an input signal and coupled to the clocked output signal for subtracting the clocked output signal from the input signal to produce a difference signal having a signal polarity and for generating the intermediate signal responsive to the difference signal. The adder-filter comprises a commutating filter coupled to the intermediate node for generating the intermediate signal in response to the difference signal.

A fourth aspect of the present invention is a commutating filter for filtering a signal having a signal polarity. The commutating filter comprises a plurality of capacitors each having a capacitor polarity, and a commutating circuit coupled to the plurality of capacitors. The commutating circuit is arranged to periodically alternate a relative polarity between the signal and the plurality of capacitors by performing one of (a) periodically alternating the signal polarity while leaving the capacitor polarity fixed, and (b) periodically alternating the capacitor polarity while leaving the signal polarity fixed.

BRIEF DESCRIPTION OF THE DRAWINGS

FIG. 3 is an electrical block diagram of a prior art commutating filter that has a frequency response with a pass-band at DC and at multiples of one-quarter of the sampling frequency of the commutating filter.

FIG. 4 is a timing diagram of four clock signals operating at a phase offset of 90° from each other derived from a common clock source for operating the commutating filter of FIG. 3.

DETAILED DESCRIPTION OF THE DRAWINGS

Figure 1:
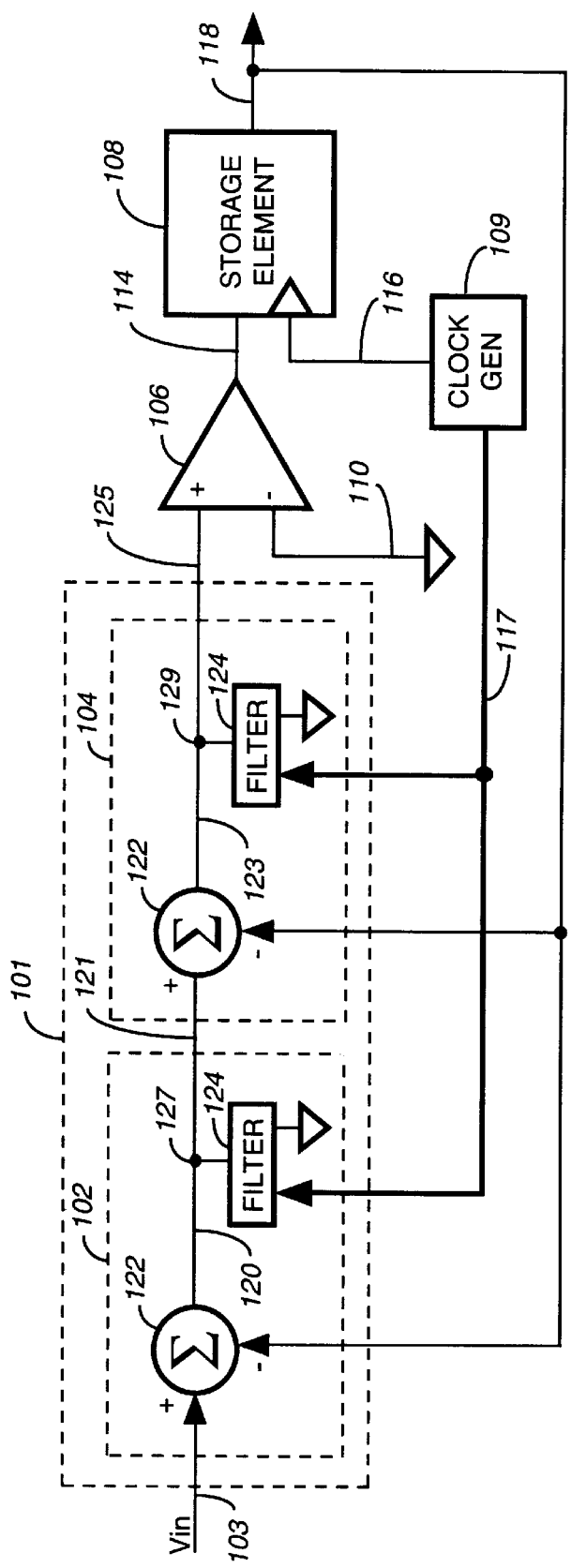
FIG. 1 is an electrical block diagram of a band-pass sigma-delta converter in accordance with the present invention.

FIG. 1 is an electrical block diagram of a band-pass sigma-delta converter 100 in accordance with the present invention. The band-pass sigma-delta converter 100 comprises a comparator 106, an adder-filter 101, a storage element 108, and a clock generator 109.

The comparator 106 is a conventional analog comparator coupled to the adder-filter 101 for making a comparison between a predetermined reference level 110 (shown as signal ground) and an intermediate signal 125 generated at an intermediate node 129 by the adder-filter 101. The comparator 106 generates a comparison result signal 114 responsive to the comparison. The storage element 108 is a conventional storage element including, for example, one or more D Flip-Flops coupled to the comparator 106 for storing the comparison result signal 114 for a predetermined delay period controlled by a master clock signal 116 generated by the clock generator 109, thereby producing a clocked output signal 118, which is fed back to the adder-filter 101. The clock generator 109 is a conventional clock generator such as, for example, a digital counter programmed to generate the master clock signal 116 at a predetermined sampling frequency and predetermined duty cycle.

The adder-filter 101 preferably comprises first and second adder-filters 102, 104 coupled in tandem. Each adder-filter includes an analog summer 122, and a filter 124 preferably comprising a commutating filter with a band-pass frequency response, and operated by a plurality of multi-phase clock signals 117 generated by the clock generator 109. The multi-phase clock signals 117 are derived from the master clock signal 116 in a conventional manner using, for example, digital counters and combinatorial logic for generating a plurality of clock signals operating at preferably one-quarter of the frequency of the master clock signal 116 with a duty cycle of 25% and offset by a phase of 90° from each other.

The adder-filter 101 is coupled to an input signal 103 and coupled to the clocked output signal 118 for subtracting the clocked output signal 118 from the input signal 103 by way of the analog summer 122 of the first adder-filter 102 to produce a difference signal 120. The difference signal 120 is band-pass filtered by the commutating filter to produce the intermediate signal 121 generated at an intermediate node 127 of the first adder-filter 102.

The clocked output signal 118 is also subtracted from the intermediate signal 121 to produce a difference signal 123, which is then band-pass filtered by the filter 124 to produce the intermediate signal 125 generated at an intermediate node 129 responsive to the difference signal 120. Each of the analog summers 122 is preferably a current generator coupled to the intermediate node 127, 129 of the first or second adder-filters 102, 104 for supplying thereto a current representing a difference signal such as the difference signals 120, 123, respectively. The comparator 106 is coupled to the intermediate node of the second adder-filter 104 for receiving the intermediate signal 125 of the second adder-filter 104.

It will be appreciated that, alternatively, the adder-filter 101 can include less or more adder-filters than two adder-filters 102, 104 included in the above embodiment.

Figure 2:
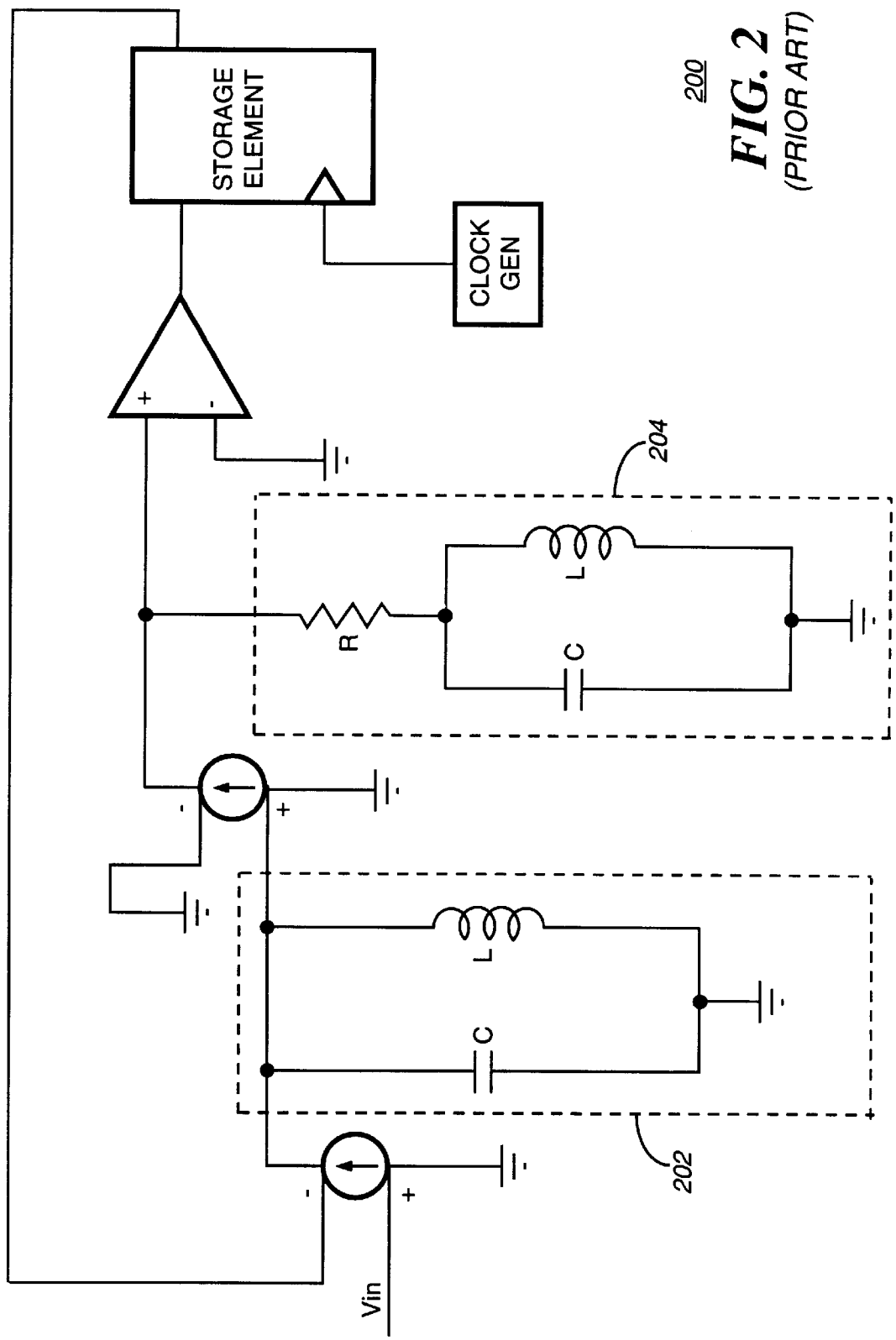
FIG. 2 is an electrical block diagram of a prior art band-pass sigma-delta converter.

FIG. 2 is an electrical block diagram 200 of a prior art band-pass sigma-delta converter. This prior art band-pass sigma-delta converter includes two band-pass filters 202, 204 comprising conventional passive inductor-capacitor (LC) tank circuits rather than commutating filters to perform the function of a band-pass filter. For a high-Q response and accurate frequency skirts, accurate values for the LC components are necessary. It is costly and therefore impractical to integrate the LC components in an integrated circuit. For this reason, the LC components are generally conventional external components coupled to, for example, an integrated circuit on a printed circuit board (PCB).

Although this approach has had some success, it in many cases suffers from severe manufacturing defects such as, for example, vertical displacement of components (commonly known as tomb stoning) during the reflow process of a PCB. Such manufacturing defects result in the recycling of PCBs on a manufacturing line and at times require scrapping PCBs when the defects are not repairable. Such defects significantly impact manufacturing costs and product cycle time. Hence, it is desirable that a band-pass filter design for a sigma-delta converter utilize an approach that allows for full-scale integration as will be described below.

FIG. 3 is an electrical block diagram of a prior art commutating filter 300 that has a frequency response with a pass-band at DC and at multiples of one-quarter of the frequency of a common clock signal (CLK) 301 depicted in FIG. 4 of the prior art commutating filter 300. A complete description of the operation of the prior art commutating filter 300 may be found in an article entitled "Design CMOS commutative filters with Qs that rival quartz. Important features include variable center frequencies, adjustable bandwidth and good dynamic range.", published on Nov. 8, 1974 by Electronic Design Magazine on pages 116 to 120, the text of which is incorporated herein by reference.

The prior art commutating filter 300 operates from four clock signals offset at 90° from each other and derived from the common clock signal 301 as shown in FIG. 4. The prior art commutating filter 300 comprises four shunt capacitors coupled to four conventional switches referenced to signal ground and controlled by one of the four clock signals (CLK1 302, CLK2 304, CLK3 306, and CLK4 308). The common clock signal 301 serves as the sampling clock of the prior art commutating filter 300. The common clock signal 301 operates preferably at four times the frequency of an incoming signal. Each clock phase activates one of the four shunt capacitors at a time, thereby accumulating a quarter cycle average of the incoming signal.

The effect of this process is that the prior art commutating filter 300 has a frequency response of a low-pass filter with a pass-band at DC and at repeated at multiples of one-quarter the frequency of the common clock signal 301. If the input signal frequency is outside the pass-band of one of these multiples, the average voltage accumulated by each shunt capacitor, when integrated over a multiplicity of cycles of the input signal, approaches zero. The prior art commutating filter 300 also provides high Q's and adjustable bandwidth that can be adjusted simply by changing the common clock signal 301 frequency.

Hence, by selecting a proper sampling frequency the prior art commutating filter 300 can be used as a band-pass filter by applying it to, for example, a band limited input signal. Furthermore, because it is not necessary to have accurate capacitors in prior art commutating filters 300, but rather capacitors that have enough capacitance to average the input signal over a single clock cycle of the sampling frequency, a prior art commutating filter 300 can be easily integrated into, for example, a CMOS integrated circuit (IC) process with a high degree of repeatability and low manufacturing cost.

For this reason, replacing the prior art parallel LC resonant circuit with the prior art commutating filter 300 is an attractive solution. This allows full integration of the band-pass sigma-delta converter 100 into an IC, thereby overcoming the deficiencies of prior art circuits as described for FIG. 2. The prior art commutating filter 300, however, has a significant flaw which results in an unstable (i.e., oscillating) band-pass sigma-delta converter. Because DC is not rejected by the prior art commutating filter 300, simulations show that the presence of a DC component in the input signal results in an unstable feedback control loop.

To overcome this deficiency, and still achieve the goal of full scale integration, a novel architecture for commutating filters is required. The novel architecture for the commutating filter must filter out DC components in order to prevent instability in a band-pass sigma-delta converter implemented with a commutating filter.

A novel commutating filter that achieves these goals comprises a plurality of capacitors each having a capacitor polarity, and a commutating circuit coupled to the plurality of capacitors. The commutating circuit is arranged to periodically alternate a relative polarity between the signal and the plurality of capacitors by performing one of: (a) periodically alternating the signal polarity while leaving the capacitor polarity fixed, and (b) periodically alternating the capacitor polarity while leaving the signal polarity fixed.

The commutating filter has a pass band centered on a center frequency, and further comprises a timing circuit coupled to the commutating circuit for periodically alternating the relative polarity in synchronism with a virtual signal operating at the center frequency. The first and second relative polarities are activated, respectively, during corresponding portions of alternate positive and negative half cycles of the virtual signal, the first and second relative polarities being opposite polarities. The virtual signal is representative of the input signal sourced by, for example, a signal operating at a monotone frequency (i.e., a sine wave).

Figure 5:
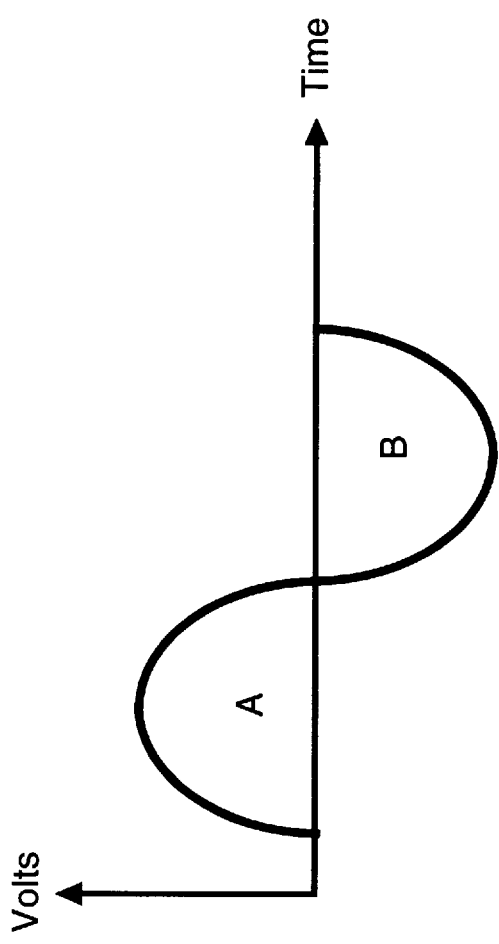
FIGS. 5 and 6 are timing diagrams depicting sampling intervals of a virtual signal.
Figure 6:
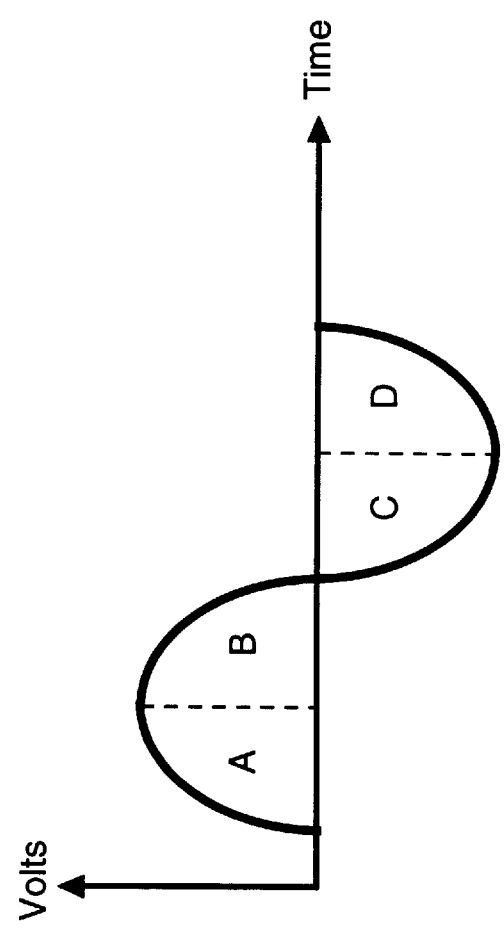

FIGS. 5 and 6 are timing diagrams depicting sampling intervals of the virtual signal. In FIG. 5, for the case of a commutating filter with a single capacitor, the capacitor is coupled to the plurality of switches in a first interconnect path that has a first polarity between the virtual signal and signal ground. During this interconnect structure, the capacitor averages the virtual signal during a first portion depicted by the letter "A." Upon changing to the second interconnect path, the capacitor is coupled in a second polarity between the virtual signal and signal ground. This polarity is opposite to the first polarity. During the activation of the second interconnect path, the capacitor averages the virtual signal during a second portion depicted by the letter "B." After sampling portion "B," the inverting circuit repeats the averaging process over subsequent cycles of the virtual signal.

Switching between the first and second interconnect paths occurs at twice the desired center frequency of the filter, multiplied by the number of capacitors utilized in the commutating filter. For example, for a commutating filter that uses a single capacitor the operating frequency of the commutating filter is twice the center frequency.

FIG. 6 illustrates a case wherein the sampling frequency of the commutating filter is four times the center frequency, hence a two capacitor commutating filter. For a two capacitor commutating filter the virtual signal is sampled by the two capacitors during four periods (depicted by the quadrants "A," "B," "C," and "D"). In the two capacitor commutating filter the inverting circuit activates a first interconnect path, wherein a first capacitor of the two capacitor structure is coupled to a first polarity between the virtual signal and signal ground. During this interconnect structure, the first capacitor averages the virtual signal during quadrant "A."

Upon activating a second interconnect path, the second capacitor is coupled to a first polarity between the virtual signal and signal ground. During this interconnect structure, the second capacitor averages the virtual signal during quadrant "B." After averaging both quadrants "A" and "B" by the first and second capacitors, respectively, the inverting circuit activates a second interconnect path with the first capacitor such that a second polarity is created between the virtual signal and signal ground, the second polarity being opposite to the first polarity previously applied. During this interconnect structure, the first capacitor averages the virtual signal during quadrant "C."

Thereafter, the inverting circuit activates a second interconnect path with the second capacitor such that a second polarity is created between the virtual signal and signal ground, the second polarity being opposite to the first polarity previously applied. During this interconnect structure, the second capacitor averages the virtual signal during quadrant "D." After all quadrants have been averaged by the two capacitors, respectively, the commutating filter repeats the averaging process over subsequent cycles of the center frequency.

It will be appreciated that a commutating filter utilizing an inverting circuit may have as many capacitor stages for averaging the input signal as are needed for a particular application. It will be further appreciated that, alternatively, the inverting circuit can comprise elements other than switches for inverting the polarity of the virtual signal with respect to one or more capacitors of the commutating filter. Other inverting circuits can include, for example, an inverting operational amplifier.

Figure 7:
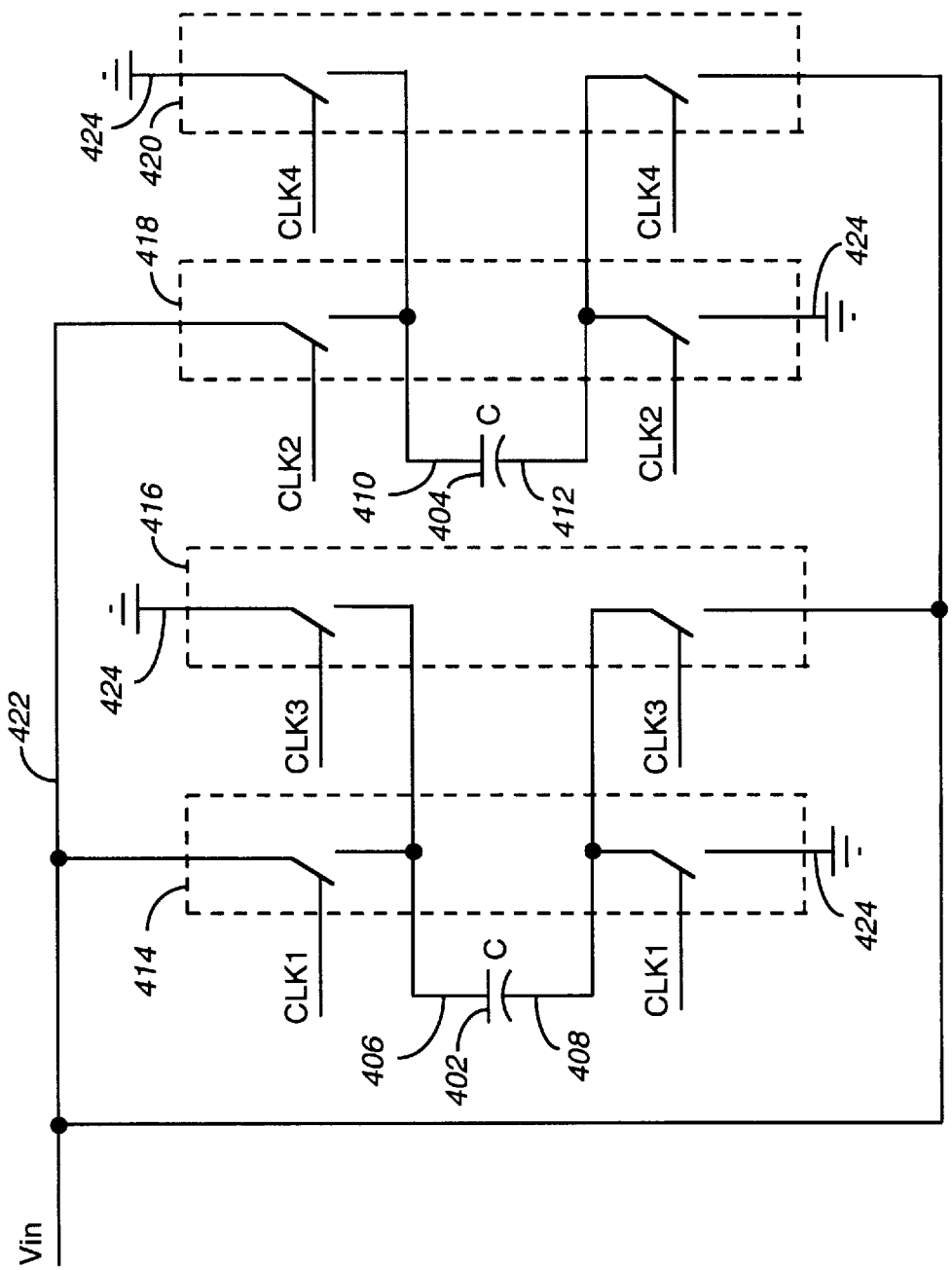
FIG. 7 is an electrical block diagram of a commutating filter that has a frequency response with a pass-band at odd multiples of one-quarter of the sampling frequency of the commutating filter and rejects DC signals in accordance with the present invention.

One embodiment of a commutating filter 400 that conforms to the above description is shown in FIG. 7. The commutating filter 400 has a frequency response with a pass-band at odd multiples of one-quarter of the sampling frequency of the commutating filter 400, but rejects DC signals in accordance with the present invention.

In this embodiment, the commutating filter 400 includes a plurality of capacitors (shown as first and second capacitors 402, 404 by way of example) each having first and second electrodes coupled to an intermediate node 422 and coupled to a second node 424, which is preferably signal ground. It will be appreciated that, alternatively, the second node can be at a different voltage potential such that the intermediate node and the second node operate as a differential signal pair. The input signal (Vin) is applied between the intermediate node 422 and the second node 424. The commutating circuit 400 further comprises an inverting circuit coupled to the first and second capacitors 402, 404, the inverting circuit including a plurality of switches coupled to the first and second electrodes of the first and second capacitors 402, 404.

The plurality of switches is arranged such that, when a first interconnect path of the plurality of switches is activated, the first and second capacitors 402, 404 are coupled in a first polarity between the intermediate node 422 and the second node 424, and when a second interconnect path of the plurality of switches is activated, the first and second capacitors 402, 404 are coupled in a second polarity between the intermediate node 422 and the second node 424, the second polarity being opposite to the first polarity.

Each of the four controllable pairs of switches 414, 416, 418, 420 shown in FIG. 7 comprise two control electrodes coupled together to form a control input (e.g., CLK1 signal coupled to the controllable pair 414). The control input of each of the four controllable pairs respectively is coupled to first, second, third, and fourth clock signals (i.e., CLK1, CLK2, CLK3, or CLK4) having a clock signal period equal to four cycles of the master clock signal 116 and arranged such that each of the four controllable pairs is activated exclusively once every four cycles of the master clock signal 116 for a duration corresponding to one cycle of the master clock signal 116.

The first, second, third, and fourth clock signals are clock signals with phases offset by 90° from each other and derived preferably from the master clock signal 116. The multi-phase clock signals 117 comprise the first, second, third, and fourth clock signals, respectively. The master clock signal 116 and the multi-phase clock signals 117 operate in the same manner as the clock signals described for FIG. 4. The first and second capacitors 402, 404 are coupled between the intermediate node 422 and the second node 424 during alternate cycles of the master clock signal 116.

Figure 8:
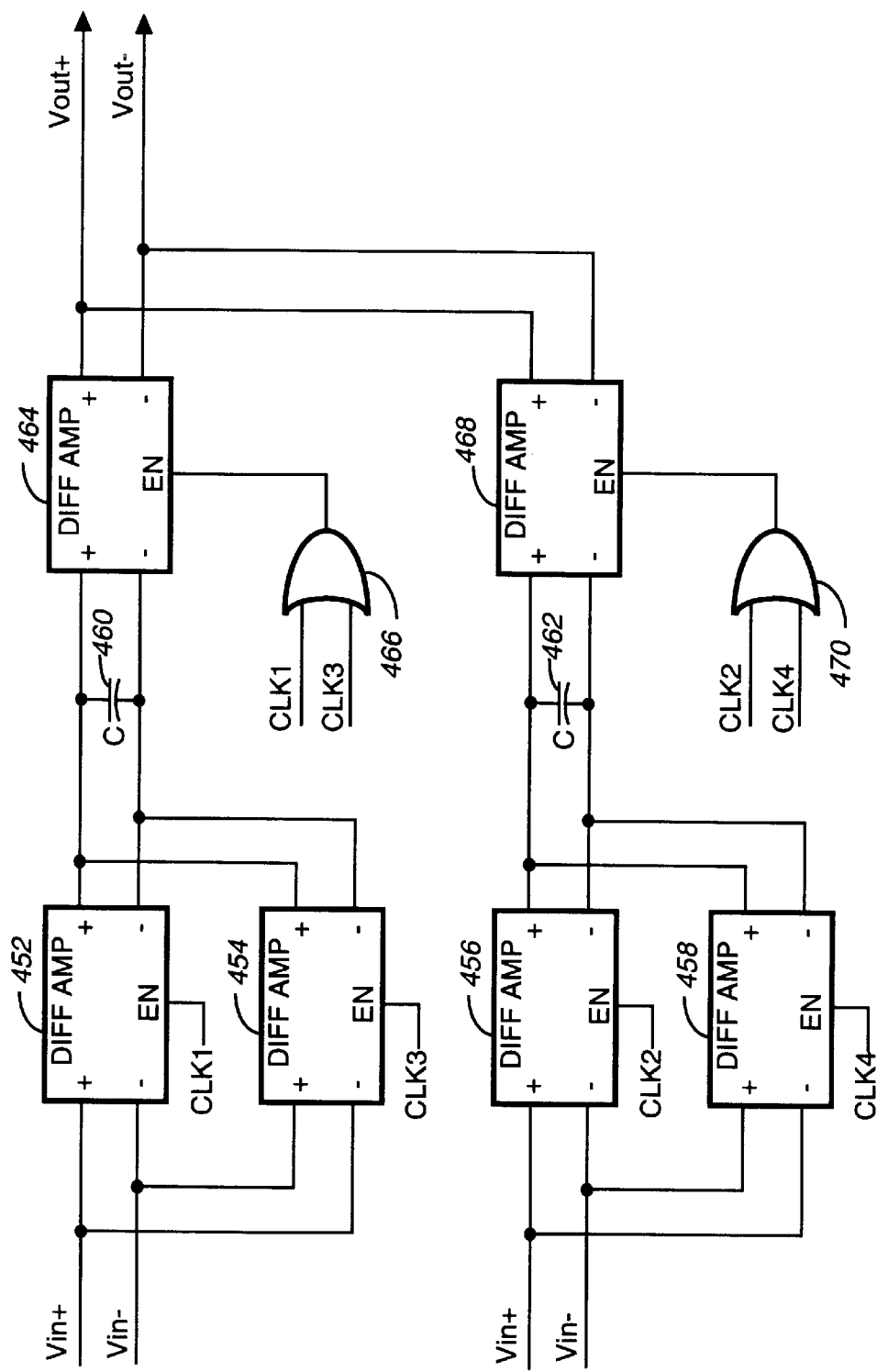
FIG. 8 is an electrical block diagram of yet another embodiment of the commutating filter that has a frequency response with a pass-band at odd multiples of one-quarter of the sampling frequency of the commutating filter and rejects DC signals in accordance with the present invention.

The commutating filter 450 of FIG. 8 shows yet another embodiment for implementing a commutating filter with no pass band at DC. The commutating filter 450 comprises a commutating circuit including six conventional differential amplifiers 452, 454, 456, 458, 464, 468 operating from the four clock phases illustrated in FIG. 4. The clock signals CLK1 through CLK4 enable the differential amplifiers such that the input differential signal (Vin) commutates onto first and second capacitors 460, 462.

The first two differential amplifiers 452, 454 are coupled to the differential input signal and the first capacitor 460. The first differential amplifier 452 operates as a non-inverting amplifier that is activated by CLK1. The second differential amplifier 454 operates as an inverting amplifier by reversing the input terminals to the input signal, and is activated by CLK3. Similarly, the third and fourth differential amplifiers 456, 458 are coupled to the input signal and the second capacitor 462, the third differential amplifier activated by CLK2 and operating as a non-inverting amplifier, and the fourth differential amplifier activated by CLK4 and operating as an inverting amplifier. The inverting amplifiers and the non-inverting amplifiers coupled to the input signal are arranged such that when the non-inverting amplifiers are activated, non-inverted signals responsive to the input signal are applied to the first and second capacitors 460, 462, respectively, and when the inverting amplifiers are activated, inverted signals responsive to the input signal are applied the first and second capacitors 460, 462, respectively.

The fifth and sixth differential amplifiers 464, 468 are coupled to the first and second capacitors 460, 462, respectively, and generate a common differential output signal (Vout). Both differential amplifiers operates as non-inverting amplifiers. The fifth differential amplifier 464 is activated by either CLK1 or CLK3 sourced by an "OR" gate 466. Similarly, the sixth differential amplifier 468 is activated by either CLK2 or CLK4 sourced by an "OR" gate 470.

This embodiment of the commutating filter 450 operates substantially like the commutating filter 400 disclosed in FIG. 7, with the exception that signals are operated on differentially. It will be appreciated that, alternatively, conventional single-ended operational amplifiers can be used. The commutating filter 450, however, has better noise immunity than the commutating filter 400 of FIG. 7. For this reason, the commutating filter 450 is a preferred embodiment.

It will be appreciated that other suitable circuit configurations for inverting the polarity of capacitors in a manner that commutates the input signal to the capacitors can be used for the commutating circuit in accordance with the present invention.

Figure 9:
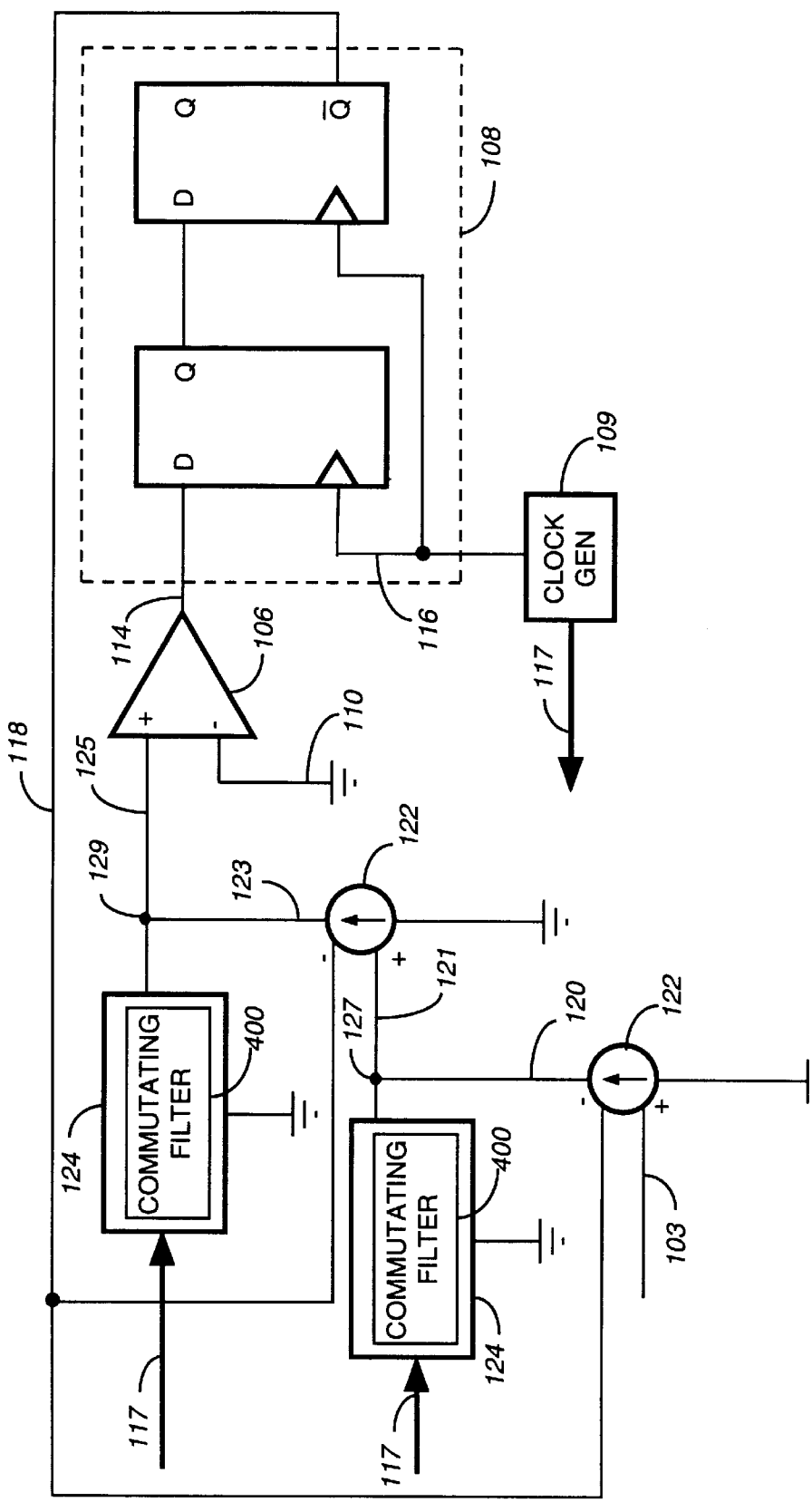
FIG. 9 is a detailed electrical block diagram of the band-pass sigma-delta converter utilizing the commutating filter in accordance with the present invention.

As noted, the architectures of the commutating filters 400, 450 are such that there is no pass-band at DC. Instead, the frequency response has pass-bands at odd multiples of one-quarter the frequency of the master clock signal 116. By rejecting DC, the commutating filters 400 can be applied to the band-pass sigma-delta converter 100 (as shown in FIG. 9) without the instability experienced by the prior art commutating filter 300. The bandwidth of the commutating filter 400 follows the expression $$BW = \frac{1}{4\pi RCm},$$

wherein m represents the number of capacitors in the commutating filter 400, C is the effective capacitance of the commutating filter 400, and R is the source resistance of the input. In this case, the commutating filter 400 preferably comprises two capacitors 402, 404. It will be appreciated that, alternatively, the commutating filter 400 can have more or less capacitors depending on a desired bandwidth of operation.

In FIG. 9 the storage element 108 comprises two conventional flip-flops coupled in tandem and driven by the master clock signal 116. The storage element 108 stores the comparison result signal 114 for one cycle of the master clock signal 116 and then generates an inverted value of the comparison result signal 114 as the clocked output signal 118 during a next subsequent cycle of the master clock signal 116. This is accomplished by utilizing two flip-flops coupled in tandem with the output of the second flip-flop inverted. The purpose for the dual flip-flops is to account for the band-pass response of the commutating filters 400. It will be appreciated, as is well-known by one of ordinary skill in the art, that only one flip-flop would be necessary had the filter 124 been a low-pass filter.

Figure 10:
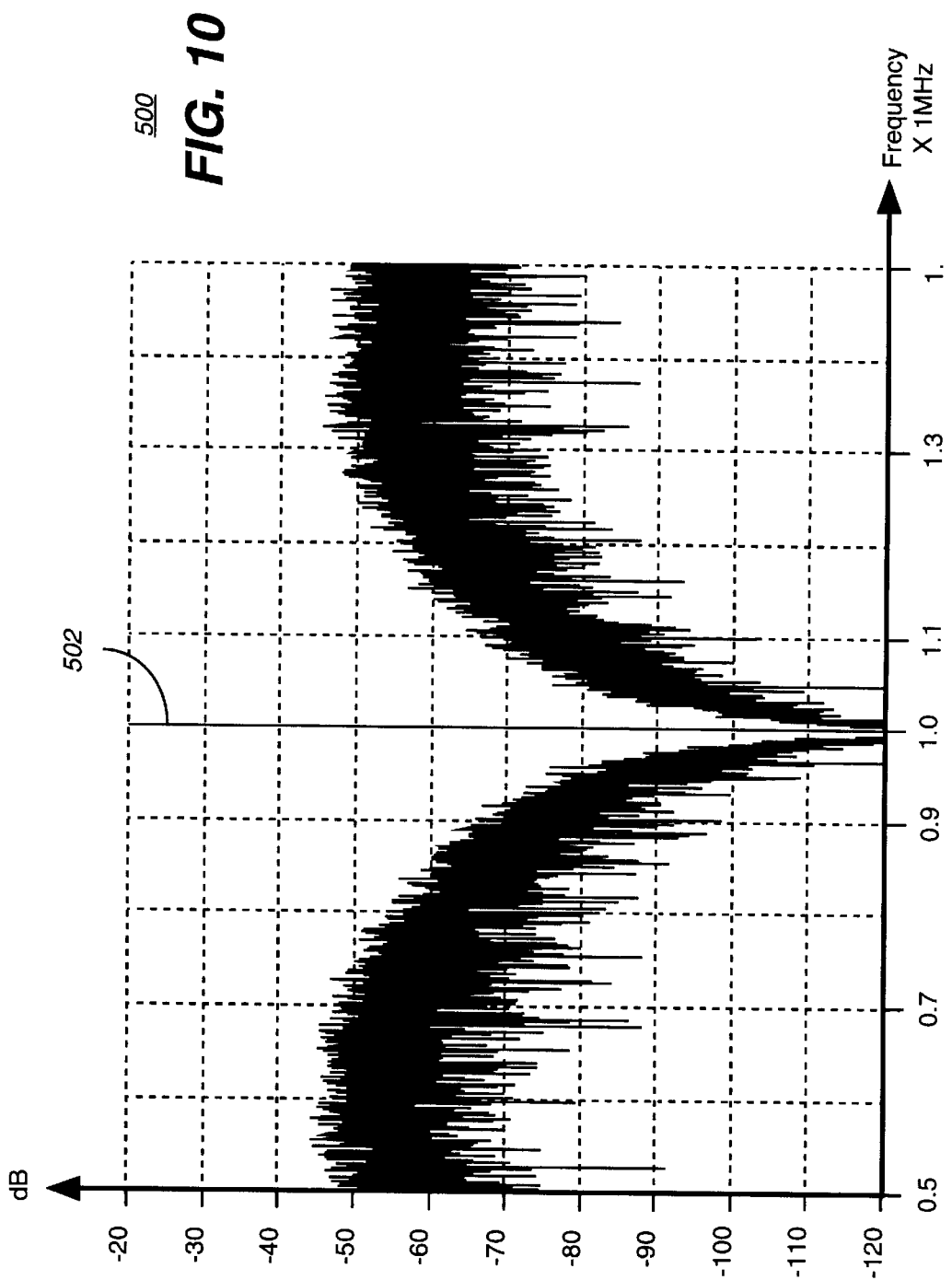
FIG. 10 is a spectral diagram of the clocked output signal depicting simulation results from the band-pass sigma-delta converter utilizing the commutating filter in accordance with the present invention.

FIG. 10 is a spectral diagram 500 of the clocked output signal 118 depicting simulation results from the band-pass sigma-delta converter 100 utilizing the commutating filter 400 in accordance with the present invention. The simulation shows that the quantization noise is shifted out of a desired pass-band 502 centered at, in this example, 1 MHz. This shifting of the quantization noise is an effect well-known in the art for sigma-delta converters utilizing band-pass filters. A complete description of the effects of sigma-delta converters utilizing band-pass filters may be found in an article by IEEE 1994 Custom Integrated Circuits Conference, entitled "10.7 MHz Bandpass Delta-Sigma A/D Modulators", published in 1994 by IEEE on pages 163 to 166, the text of which is incorporated herein by reference.

Figure 11:
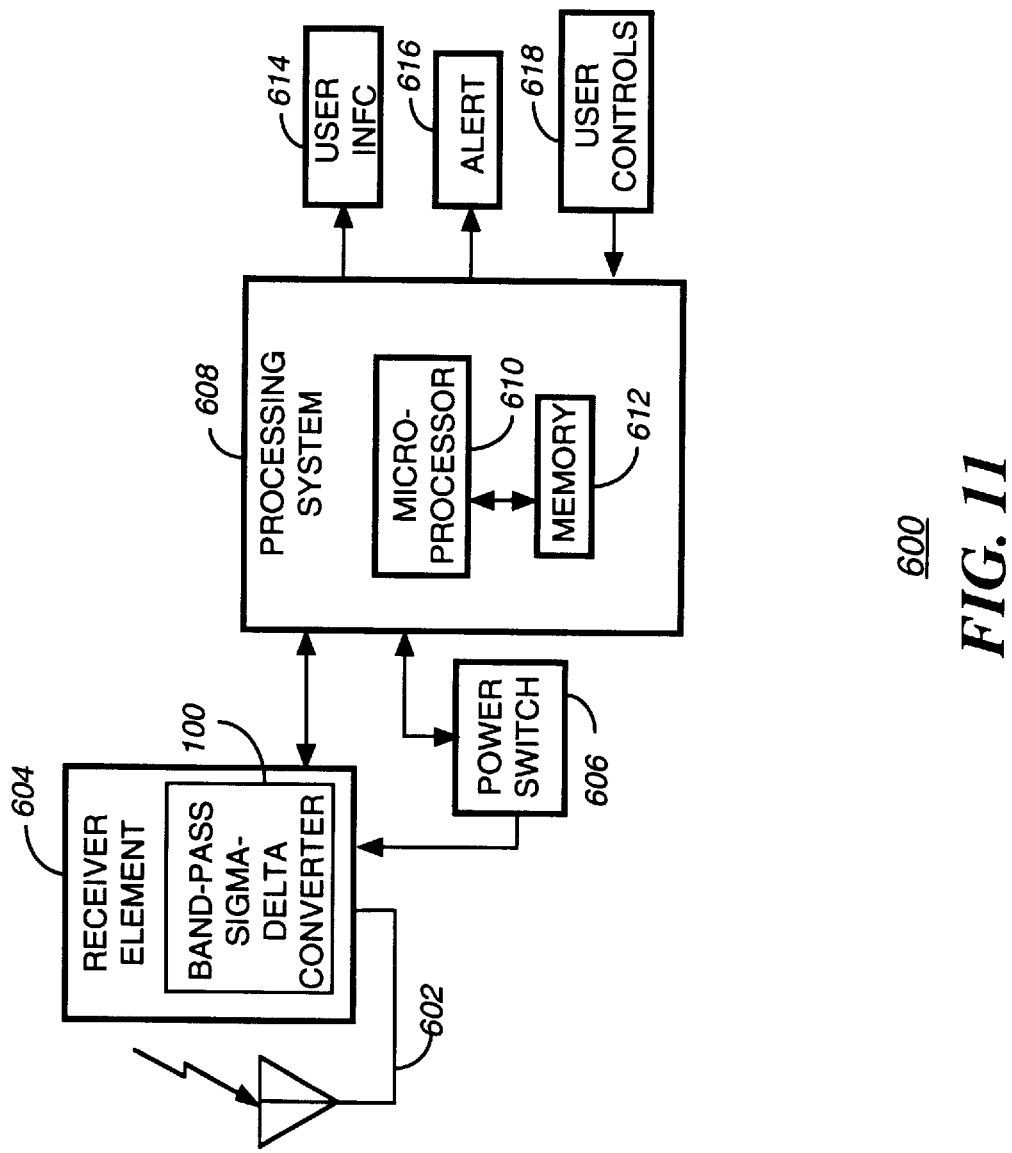
FIG. 11 is an electrical block diagram of a communication receiver using the band-pass sigma-delta converter in accordance with the present invention.

FIG. 11 is an electrical block diagram of a communication receiver 600 using the band-pass sigma-delta converter 100 in accordance with the present invention. The communication receiver 600 receives selective call signals, composed of selective call messages, transmitted by a conventional radio communication system (not shown) using techniques well known in the art. The selective call messages are originated by a caller who communicates with the radio communication system in a conventional manner to send messages intended for the user of the communication receiver 600.

The communication receiver 600 comprises a receiver antenna 602, a receiver element 604, a power switch 606, a processing system 608, user controls 618, an alerting device 616, and a user interface 614.

The receiver antenna 602 is coupled to the receiver element 604 for receiving the selective call signal transmitted as an RF signal by the radio communication system. The receiver element 604 down-converts the RF signal to derive an analog intermediate frequency (IF) signal using techniques well known in the art. The receiver element 604 includes the band-pass sigma-delta converter 100, described above, coupled to the analog IF signal for generating the clocked output signal 118. The processing system 608 is coupled to the clocked output signal 118 and is programmed to sample the clocked output signal 118 to process the samples, thereby producing a digital average of the RF signal. Essentially, the band-pass sigma-delta converter 100 performs the function of an analog-to-digital converter.

It will be appreciated that, alternatively, the band-pass sigma-delta converter 100 can be an integral element of the processing system 608. It will be further appreciated that, alternatively, the band-pass sigma-delta converter 100 can be implemented as an application specific integrated circuit (ASIC) coupled to the receiver element 604 and the processing system 608.

The receiver element 604 is also coupled to the power switch 606. The power switch 606 utilizes a conventional circuit element such as, for example, a MOS switch for shutting down power to the receiver element 604. Operation of the power switch 606 is controlled by the processing system 608, which determines particular moments during the decoding process of the selective call signal when shutdown of the receiver element 604 is appropriate for providing a conventional battery saving function.

The processing system 608 controls the overall operations of the communication receiver 600. One such operation is decoding the selective call message. This operation is accomplished by processing the selective call message from the digital average by way of the elements of the processing system 608 which perform the function of a message processing system.

The elements of the processing system 608 include a microprocessor 610, and a memory 612. The microprocessor 610 is similar to the M68HC08 micro-controller manufactured by Motorola, Inc. It will be appreciated that other similar processors can be utilized for the microprocessor 610, and that additional processors of the same or alternative type can be added as required to handle the processing requirements of the microprocessor 610.

The memory 612 includes, for example, a conventional random access memory (RAM), and a conventional read-only memory (ROM). The RAM is used for storage and processing of, for example, the samples of the clocked output signal 118. The ROM section is used for storage of the instructions that control the operation of the processing system 608. It will be appreciated that other types of memory may be used such as, for example, FLASH memory. It will be further appreciated that the memory 612, singly or in combination, can be an integral portion of the microprocessor 610.

The processing system 608 is programmed to decode a selective call address from the selective call message, compare the decoded selective call address with one or more of the selective call addresses stored in the memory 612, and when a match is detected, proceed to process the remaining portion of the selective call message. After the processing system 608 has processed the selective call message, the selective call message is stored in the memory 612, and a call alerting signal is generated to alert a user that the selective call message has been received. The call alerting signal is directed to a conventional audible or tactile alerting device 616 for generating an audible or tactile call alerting signal.

The selective call message can be accessed by the user through user controls 618, which provide functions such as lock, unlock, delete, read, etc. More specifically, by the use of appropriate functions provided by the user controls 618, the message is recovered from the memory 612, and then displayed on the user interface 614. The user interface 614 is a conventional display such as, for example, a liquid crystal display (LCD) used for conveying the information included in the selective call message to the user.

The present invention provides a method for applying a novel band-pass filter to a sigma-delta converter. In particular, the band-pass filter is implemented with a commutating filter 400 that utilizes a novel method for suppressing a DC signal, thereby maintaining stability in the control loop of the band-pass sigma-delta converter 100. Moreover, the commutating filter 400 provides a method for reducing part count, is low in power consumption, and allows full integration of all components of the sigma-delta converter into an IC without relying on conventional external capacitors and/or inductors for tuning the band-pass response of the filters used by the band-pass sigma-delta converter 100. This readily allows for ease of duplicating the circuit of the band-pass sigma-delta converter 100 with minimal manufacturing defects, thereby reducing cost.

What is claimed is:

1. A commutating filter for filtering a signal having a signal polarity, the commutating filter comprising:

a plurality of capacitors each having a capacitor polarity; and a commutating circuit coupled to the plurality of capacitors, the commutating circuit arranged to periodically alternate a relative polarity between the signal and the plurality of capacitors by performing one of:

(a) periodically alternating the signal polarity while leaving the capacitor polarity fixed; and (b) periodically alternating the capacitor polarity while leaving the signal polarity fixed.

2. The commutating filter of claim 1, wherein the commutating filter has a pass band centered on a center frequency, and wherein the commutating circuit comprises a timing circuit for periodically alternating the relative polarity in synchronism with a virtual signal operating at the center frequency, such that first and second relative polarities are activated, respectively, during corresponding portions of alternate positive and negative half cycles of the virtual signal, the first and second relative polarities being opposite polarities.

3. The commutating filter of claim 1, wherein the commutating circuit comprises an inverting amplifier and a non-inverting amplifier coupled to an input signal, the commutating circuit arranged such that when the non-inverting amplifier is activated, a non-inverted signal responsive to the input signal is applied to the plurality of capacitors, and when the inverting amplifier is activated, an inverted signal responsive to the input signal is applied to the plurality of capacitors.

4. The commutating filter of claim 1, wherein the plurality of capacitors have first and second electrodes coupled to an intermediate node and coupled to a second node, and wherein the signal is applied between the intermediate node and the second node, and wherein the commutating circuit comprises an inverting circuit comprises a plurality of switches coupled to the first and second electrodes of the plurality of capacitors, the plurality of switches arranged such that, when a first interconnect path of the plurality of switches is activated, the plurality of capacitors is coupled in a first polarity between the intermediate node and the second node, and when a second interconnect path of the plurality of switches is activated, the plurality of capacitors are coupled in a second polarity between the intermedicate node and the second node, the second polarity being opposite to the first polarity.

* * * * *